United States Patent
Oh

(10) Patent No.: US 8,018,775 B2
(45) Date of Patent: Sep. 13, 2011

(54) NONVOLATILE MEMORY DEVICE AND METHOD OF VERIFYING THE SAME

(75) Inventor: Seung Min Oh, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 77 days.

(21) Appl. No.: 12/650,978

(22) Filed: Dec. 31, 2009

(65) Prior Publication Data

US 2010/0302852 A1    Dec. 2, 2010

(30) Foreign Application Priority Data

May 29, 2009   (KR) .................. 10-2009-0047825

(51) Int. Cl.
*G11C 11/34* (2006.01)
*G11C 16/06* (2006.01)

(52) U.S. Cl. .............................. 365/185.22; 365/185.21

(58) Field of Classification Search .............. 362/185.22
See application file for complete search history.

(56) References Cited

U.S. PATENT DOCUMENTS

| | | | |
|---|---|---|---|
| 7,099,213 B2 * | 8/2006 | Ju | 365/203 |
| 2008/0144370 A1 * | 6/2008 | Park et al. | 365/185.03 |
| 2008/0205138 A1 * | 8/2008 | Wang et al. | 365/185.03 |
| 2008/0298133 A1 * | 12/2008 | Kim et al. | 365/185.22 |

FOREIGN PATENT DOCUMENTS

KR   1020080078514   8/2008

OTHER PUBLICATIONS

Notice of Allowance issued from Korean Intellectual Property Office on Dec. 23, 2010.

* cited by examiner

*Primary Examiner* — Hoai V Ho
*Assistant Examiner* — Min Huang
(74) *Attorney, Agent, or Firm* — IP & T Group LLP

(57) ABSTRACT

A nonvolatile memory device having a memory cell array configured to include a number of memory cells coupled to a bit line, a control circuit configured to output a code signal in response to a verification operation command signal during a verification operation being performed, a page buffer operation voltage generator configured to generate a precharge signal and a sense signal in response to the code signal, and a page buffer configured to precharge the bit line in response to the precharge signal and to sense data programmed into the memory cell in response to the sense signal. A sense signal having a sequentially lowered voltage level is outputted in response to the verification operation being repeatedly performed.

20 Claims, 4 Drawing Sheets

100

NONVOLATILE MEMORY DEVICE AND METHOD OF VERIFYING THE SAME

CROSS-REFERENCE TO RELATED APPLICATIONS

Priority to Korean patent application number 10-20090047825 filed on May 29, 2009, the entire disclosure of which is incorporated by reference herein, is claimed.

BACKGROUND OF THE INVENTION

Embodiments of the present invention relate to a nonvolatile memory device and a method of verifying the same and, more particularly, to a nonvolatile memory device and a method of verifying the same, which perform a stabilized verification operation.

In recent years, there is an increasing demand for nonvolatile memory devices which can be electrically programmed and erased and which do not require the refresh function of rewriting data at specific time intervals. To develop a high capacity of a memory device capable of storing a large amount of data, technology for a high degree of integration of memory cells is being developed.

For the high degree of integration of memory cells, a NAND type flash memory device in which a number of memory cells are coupled in series to form one cell string and two cell strings share one contact has been developed. In such a NAND type flash memory device, program and erase operations are performed by controlling the threshold voltage of a memory cell while injecting or discharging electrons into or from a floating gate according to F-N tunneling.

Accordingly, an erased memory cell has a negative threshold voltage because electrons are discharged from a floating gate. A programmed memory cell has a positive threshold voltage because electrons are injected into a floating gate. However, the NAND type flash memory device has defects resulting from a charge gain or a loss of charges, and so several verification operations are performed on the memory device in relation to such characteristics. A page buffer is used to verify whether the program and erase operations have been properly performed.

A verification method using a known page buffer is performed by precharging the bit line of a memory cell array, coupled to the page buffer, to a high level voltage for a set period of time and then supplying a verification voltage to the word line of a memory cell coupled to the bit line in order to detect the voltage level of the corresponding bit line.

Recently, to further increase the degree of integration of the memory cells, active research is being carried out on a multi-bit cell which is capable of storing plural data in one memory cell. This type of a memory cell is called a multi-level cell (MLC). A memory cell capable of storing a single bit in one memory cell is called a single level cell (SLC).

The MLC has several distributions of threshold voltages. In such an MLC, a program operation is verified by performing several verification operations. That is, a selected bit line of a corresponding memory cell array is precharged to a high level voltage for a set period of time, and several verification operations are then performed in order to verify whether the voltage level of the bit line has been maintained at a high level or has been discharged to a low level. In this case, a leakage current is generated in the bit line, initially precharged to a high level, because of several verification operations occurring after a passage of time, which can lead to a gradual drop in the voltage level of the bit line. Accordingly, in a subsequent verification operation, a problem can occur in which the corresponding memory cell is verified to have been successfully programmed even though it has not been successfully programmed.

BRIEF SUMMARY OF THE INVENTION

Embodiments of the present invention relate to a nonvolatile memory device and a method of verifying the same, which sense the voltage level of a bit line as being a constant voltage level even though the voltage level of the bit line gradually drops after a passage of time.

A nonvolatile memory device according to an embodiment of the present invention includes a memory cell array configured to have a number of memory cells coupled to a bit line, a control circuit configured to output a code signal in response to a verification operation command signal during a verification operation being performed, a page buffer operation voltage generator configured to generate a precharge signal and a sense signal in response to the code signal, and a page buffer configured to precharge the bit line in response to the precharge signal and to sense data programmed into the memory cell in response to the sense signal. A sense signal having a sequentially lowered voltage level is outputted in response to the verification operation being repeatedly performed.

Although the voltage level of the precharged bit line is lowered after a passage of time, the page buffer is configured to sense the voltage level of the precharged bit line as being a constant voltage level in response to the sense signal having the sequentially lowered voltage level.

The control circuit includes a code counter. The code counter outputs the code signal, including information as to the number of verification operations having been performed, in response to the verification operation command signal, a Y code signal, a program flag signal, and a verification operation enable signal.

The page buffer includes a latch unit configured to either temporarily store the program data or to sense verification data through a sense node or to store the sensed verification data, a bit line sense unit coupled between the sense node and the bit line and configured to output the voltage level of the bit line to the sense node in response to the sense signal, and a precharge unit coupled to the sense node and configured to precharge the sense node and the bit line coupled to the sense node, in response to the precharge signal.

The bit line sense unit controls the amount of current flowing through the sense node and through the bit line in response to a second sense signal having a voltage level less than that of a first sense signal supplied during a previous verification operation, in response to a number of verification operations being consecutively performed after the bit line has been precharged.

The bit line sense unit controls the amount of current to always be constant in response to a number of verification operations being consecutively performed.

According to another embodiment of the present invention, a verification method of a nonvolatile memory device having a memory cell is provided, the nonvolatile memory device having a memory cell array including a number of memory cells coupled to a bit line, and a page buffer, having a bit line sense unit configured to couple the bit line to a sense node. The method includes performing a program operation on a selected one of the memory cells by supplying the selected memory cell with a program voltage, precharging the bit line, sensing a voltage level of the bit line, which varies according to a program state of the selected memory cell, through the sense node and performing a first verification operation based on the sensed voltage level of the bit line, the voltage level of the bit line being transmitted to the sense node in response to a first sense signal, setting a second sense signal having a voltage level less than that of the first sense signal, and performing a second verification operation with the second sense signal.

The verification method further includes, after performing the second verification operation, setting a third sense signal having a voltage level less than that of the second sense signal, and performing a third verification operation with the third sense signal.

The verification method further includes, after the first and second verification operations have been performed, determining whether the program operation is a pass or a failure. The program operation steps are again performed in response to the program operation being determined to be a failure.

The second verification operation is performed with the second sense signal in order to compensate for a reduction in the voltage level of the bit line in response to the second verification operation being performed, the voltage level of the bit line being less than the voltage level of the bit line in response to the first verification operation being performed.

The bit line sense unit sends a constant amount of current to the sense node in response to the first and second sense signals irrespective of the voltage level of the precharged bit line being changed.

Figure 1:
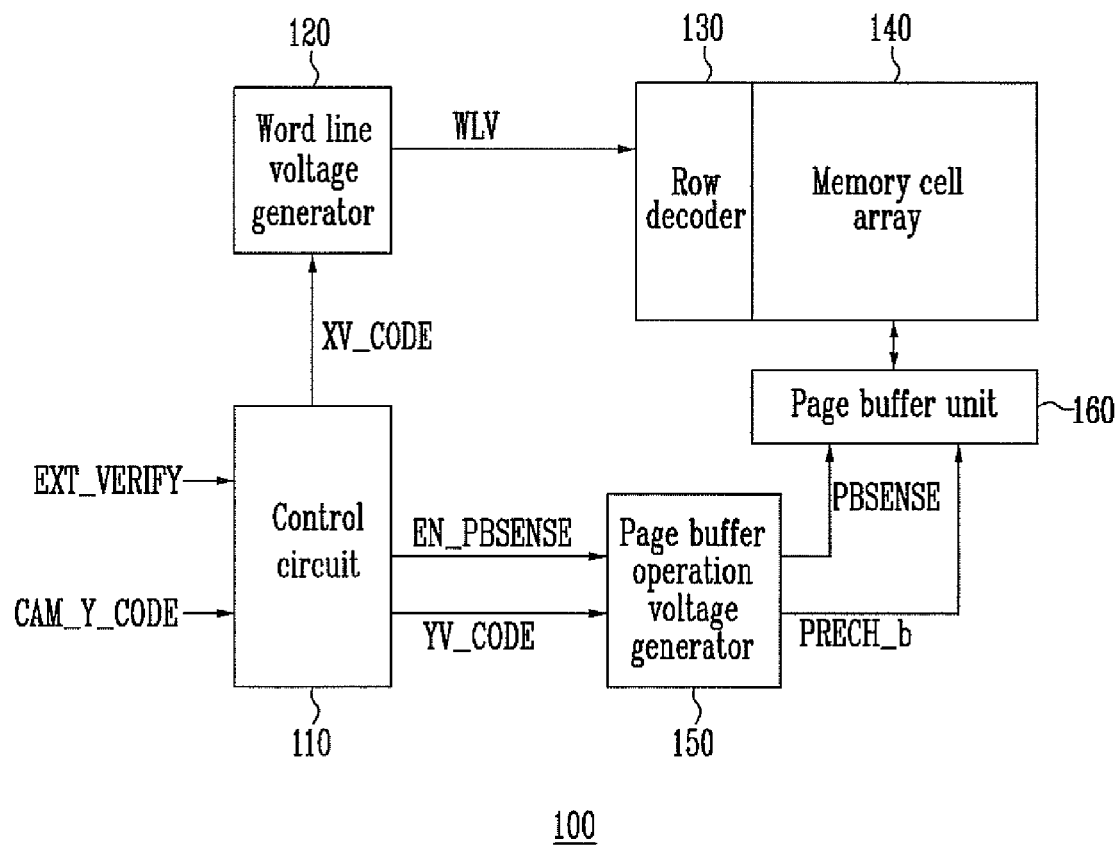
FIG. 1 is a block diagram of a nonvolatile memory device according to an embodiment of the present invention.

DESCRIPTION OF EXEMPLARY
EMBODIMENTS OF THE INVENTION

Hereinafter, embodiments of the present invention are described in detail with reference to the accompanying drawings. The drawing figures are provided to allow those having ordinary skill in the art to understand the scope of the embodiments of the present invention.

FIG. 1 is a block diagram of a nonvolatile memory device according to an embodiment of the present invention.

Referring to FIG. 1, the nonvolatile memory device includes a control circuit 110, a word line voltage generator 120, a row decoder 130, a memory cell array 140, a page buffer operation voltage generator 150, and a page buffer unit 160.

The control circuit 110 is configured to output a first code signal XV_CODE to the word line voltage generator 120 and a sense enable signal EN_PBSENSE and a second code signal YV_CODE to the page buffer operation voltage generator 150, in response to a verification operation command signal EXT_VERIFY and a Y code signal CAM_Y_CODE stored in a CAM cell. The control circuit 110 is configured to count the number of verification operations and to generate the second code signal YV_CODE including the counting information.

The word line voltage generator 120 is configured to output a word line voltage WLV to the row decoder 130 in response to the first code signal XV_CODE.

The row decoder 130 is configured to supply the word line voltage WLV to a word line of the memory cell array 140.

The page buffer operation voltage generator 150 is configured to generate a sense signal PBSENSE and a precharge signal PRECH_b, which are generated during a verification operation being performed, in response to the sense enable signal EN_PBSENSE and the second code signal YV_CODE. The page buffer operation voltage generator 150 is configured to control a voltage level of the sense signal PBSENSE in response to the second code signal YV_CODE. The page buffer operation voltage generator 150 preferably is configured to generate the sense signal PBSENSE whose voltage level is sequentially lowered during the repetition of verification operations in response to the second code signal YV_CODE.

The page buffer unit 160 is configured to precharge a selected bit line of the memory cell array to a high level in response to the precharge signal PRECH_b and to verify the voltage level of the bit line during a verification operation by sensing the voltage level of the bit line in response to the sense signal PBSENSE.

Figure 2:
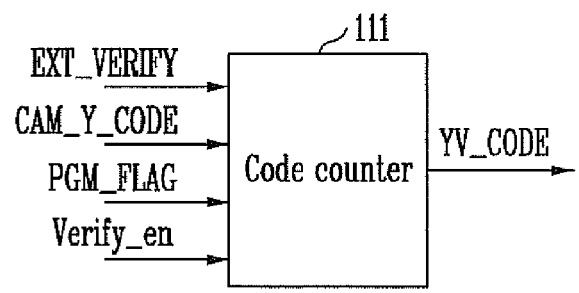
FIG. 2 shows the construction of a code counter included in the control circuit of FIG. 1.

FIG. 2 shows the construction of a code counter 111 included in the control circuit of FIG. 1.

Referring to FIG. 2, the code counter 111 is configured to generate the second code signal YV_CODE, including information as to the number of verification operations having been performed, in response to the verification operation command signal EXT_VERIFY, the Y code signal CAM_Y_CODE, a program flag signal PGM_FLAG, and a verification operation enable signal.

Figure 3:
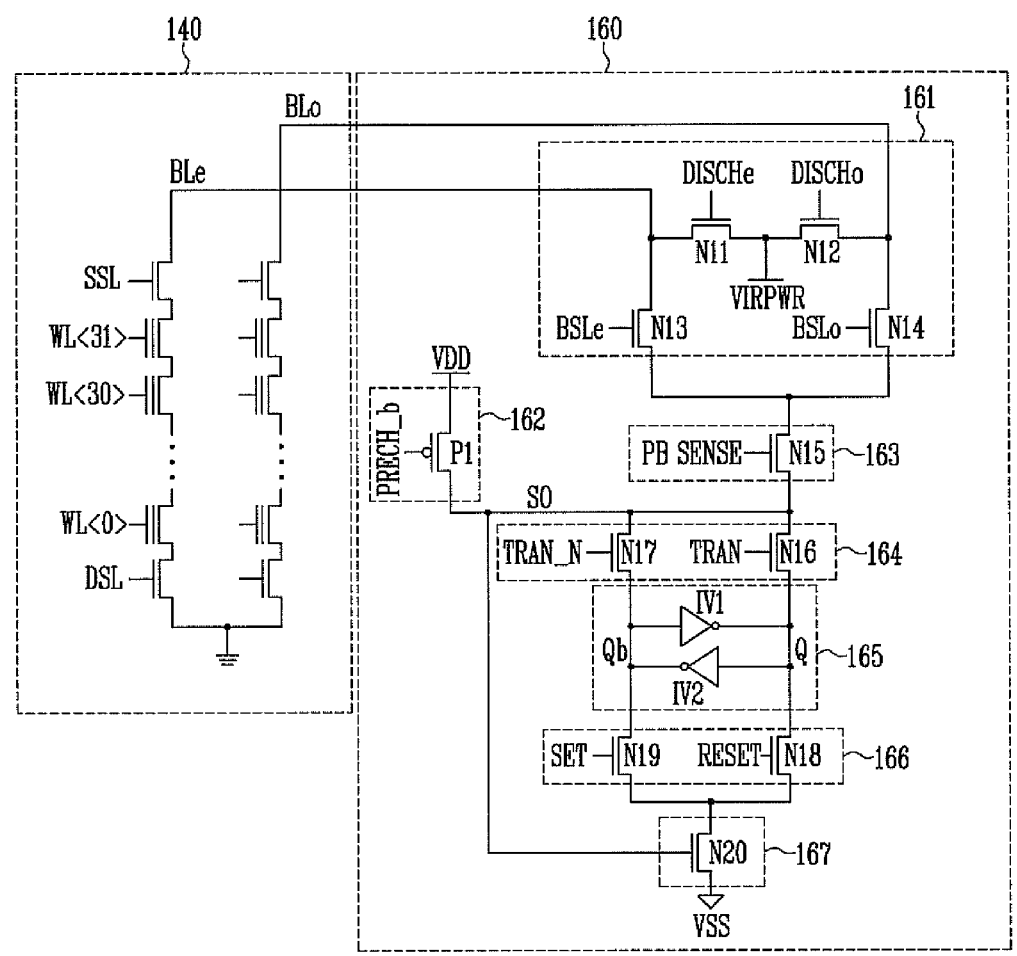
FIG. 3 is a circuit diagram of a memory cell array and a page buffer unit according to an embodiment of the present invention.

FIG. 3 is a circuit diagram of the memory cell array 140 and the page buffer unit 160 according to an embodiment of the present invention.

Referring to FIG. 3, the memory cell array 140 includes memory cells for storing data, word lines WL for selecting and activating the memory cells, and bit lines BLe, BLo for inputting and outputting data stored in the memory cells. A plurality of the word lines WL and a plurality of the bit lines BLe are arranged in a matrix form. In the memory cell array 140, the memory cells are coupled in series between a source select transistor having an SSL inputted thereto and a drain select transistor having a DSL inputted thereto, which is called a string structure. The gates of the memory cells are coupled to the respective word lines. A group of the memory cells in common coupled to the same word line is called a page. A plurality of the cell strings coupled to the respective bit lines is coupled in parallel to a global source line, thus forming a block.

The page buffer unit 160 includes a bit line selection unit 161, a bit line sense unit 163, a sense node precharge unit 162, a data latch unit 165, a data transmission unit 164, a data set unit 166, and a sense node sense unit 167. The bit line the selection unit 161 is configured to selectively couple a sense node SO to a bit line coupled to a specific memory cell of the memory cells. The bit line sense unit 163 is configured to sense data stored in a specific cell when a specific bit line and the sense node SO are coupled together in read and verification operations. The sense node precharge unit 162 is configured to supply the sense node SO with a high level power supply voltage. The data latch unit 165 is configured to temporarily store verification data read from a specific cell. The data transmission unit 164 is configured to supply the sense node SO with data, stored in the data latch unit 165, in response to a program operation being performed. The data set unit 166 is configured to input data to be stored in the data latch unit 165. The sense node sense unit 167 is configured to supply a specific node of the data latch unit 165 with a ground voltage in response to a voltage level of the sense node SO.

The bit line selection unit 161 includes an NMOS transistor N13 and an NMOS transistor N14. The NMOS transistor N13 is configured to couple the even bit line BLe to the sense node SO via the bit line sense unit 163 in response to a first bit line selection signal BSLe. The NMOS transistor N14 is configured to couple the odd bit line BLo to the sense node SO via the bit line sense unit 163 in response to a second bit line selection signal BSLo.

The bit line selection unit 161 further includes a control signal input terminal, an NMOS transistor N11, and an NMOS transistor N12. The control signal input terminal is configured to supply a control signal VIRPWR of a specific level. The NMOS transistor N11 is configured to couple the even bit line BLe to the control signal input terminal in response to a first discharge signal DISCHe. The NMOS transistor N12 is configured to couple the odd bit line BLo to the control signal input terminal in response to a second discharge signal DISCHo.

The bit line sense unit 163 is configured to selectively couple the bit line selection unit 161 to the sense node SO in response to the sense signal PBSENSE. To this end, the bit line sense unit 163 includes an NMOS transistor N15 coupled between the bit line selection unit 161 and the sense node SO. A detailed operation of the bit line sense unit 163 is described later.

The sense node precharge unit 162 is configured to supply the sense node SO with a high level power supply voltage VDD in response to the precharge signal PRECH_b. To this end, the sense node precharge unit 162 includes a PMOS transistor P1 coupled between a terminal for the power supply voltage VDD and the sense node SO. A detailed operation of the sense node precharge unit 162 is described later.

The data latch unit 165 is configured to temporarily store data to be programmed into a specific memory cell or to temporarily store data read from a specific memory cell. To this end, the data latch unit 165 includes a first inverter IV1 and a second inverter IV2. The output terminal of the first inverter IV1 is coupled to the input terminal of the second inverter IV2, and the output terminal of the second inverter IV2 is coupled to the input terminal of the first inverter IV1.

A node at which the output terminal of the first inverter IV1 is coupled to the input terminal of the second inverter IV2 is called a first node Q. A node at which the output terminal of the second inverter IV2 is coupled to the input terminal of the first inverter IV1 is called a second node Qb.

For example, in response to data of a high level being supplied to the first node Q, the corresponding data are reversed by the second inverter IV2, and so that data of a low level are supplied to the second node Qb. The data of a low level are reversed by the first inverter IV1, and accordingly, the data of a high level, supplied to the first node Q, remain intact. Accordingly, a data storage effect is generated. On the other hand, in response to data of a low level being supplied to the first node Q, the corresponding data are reversed by the second inverter IV2, and so that data of a high level are supplied to the second node Qb. The data of a high level are reversed by the first inverter IV1, and accordingly, the data of a low level, supplied to the first node Q, remain intact. Accordingly, a data storage effect is generated.

The data transmission unit 164 is configured to selectively supply the sense node SO with data stored in the first node Q or the second node Qb of the data latch unit 165. To this end, the data transmission unit 164 includes a first transfer transistor N16 configured to selectively couple the first node Q to the sense node SO and a second transfer transistor N17 to selectively couple the second node Qb to the sense node SO.

The first transfer transistor N16 is configured to transfer data, stored in the first node Q, to the sense node SO in response to a first data transfer signal TRAN. Furthermore, the second transfer transistor N17 is configured to transfer data, stored in the second node Qb, to the sense node SO in response to a second data transfer signal TRAN_N.

Accordingly, in response to data stored in the first node Q being transferred to the sense node SO, the first data transfer signal of a high level is supplied to the first transfer transistor N16. In response to data stored in the second node Qb being transferred to the sense node SO, the second data transfer signal of a high level is supplied to the second transfer transistor N17.

The data set unit 166 includes a first data set transistor N18 configured to supply a ground voltage VSS to the first node Q of the data latch unit 165 and a second data set transistor N19 configured to supply the ground voltage VSS to the second node Qb.

The first data set transistor N18 is coupled between the sense node sense unit 167 and the first node Q. The first data set transistor N18 is configured to supply the first node Q with the ground voltage VSS, received from the sense node sense unit 167, in response to a first data set signal RESET.

Furthermore, the second data set transistor N19 is coupled between the sense node sense unit 167 and the second node Qb. The second data set transistor N19 is configured to supply the second node Qb with the ground voltage VSS, received from the sense node sense unit 167, in response to a second data set signal SET.

The sense node sense unit 167 is configured to supply the ground voltage VSS to the data set unit 166 in response to a voltage level of the sense node SO. To this end, the sense node sense unit 167 includes an NMOS transistor N20 coupled between the data set unit 166 and a terminal for the ground voltage VSS.

Accordingly, the sense node sense unit 167 supplies the ground voltage VSS to the data set unit 166 in response to a voltage level of the sense node SO. The sense node sense unit 167 supplies the ground voltage VSS to the data set unit 166 only when a voltage level of the sense node SO is at a high level. When the first data set signal RESET of a high level is received, the ground voltage VSS is supplied to the first node Q. Accordingly, data of a low level are supplied to the first node Q. In response to the second data set signal SET of a high level being received, the ground voltage VSS is supplied to the second node Qb. Accordingly, data of a high level are supplied to the first node Q.

Figure 4:
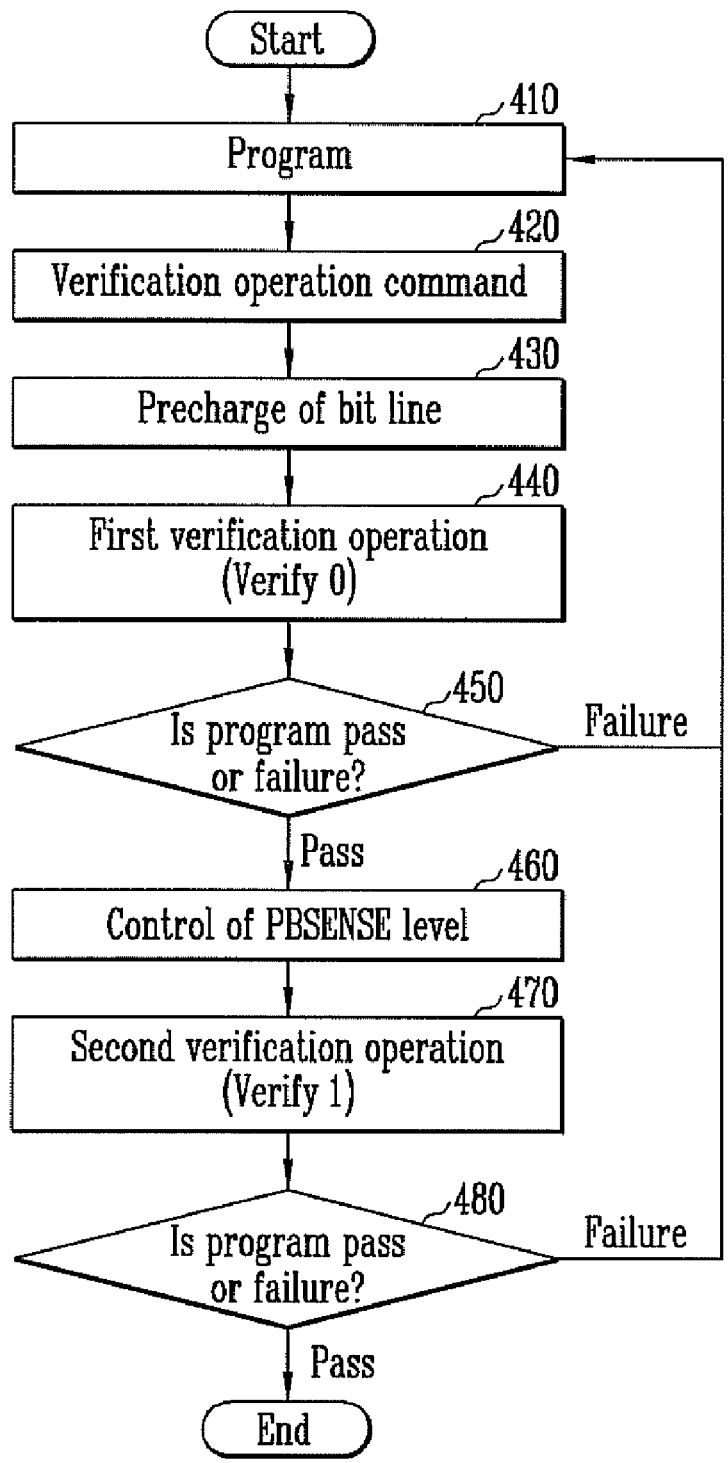
FIG. 4 is a flowchart illustrating a verification operation of the nonvolatile memory device according to an embodiment of the present invention.
Figure 5:
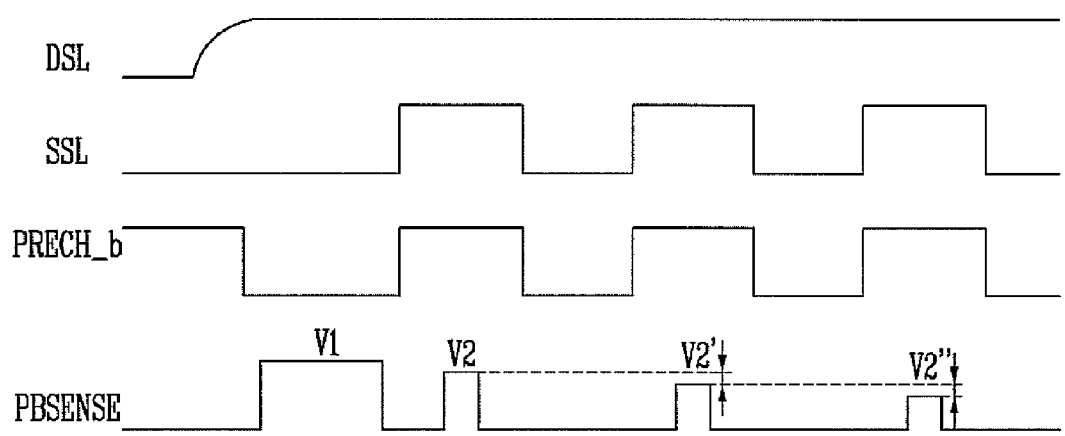
FIG. 5 is a waveform of signals supplied when the verification operation of the nonvolatile memory device is performed according to an embodiment of the present invention.

FIG. 4 is a flowchart illustrating a verification operation of the nonvolatile memory device according to an embodiment of the present invention. FIG. 5 is a waveform diagram of signals supplied when the verification operation of the nonvolatile memory device is performed according to an embodiment of the present invention.

The verification operation of the nonvolatile memory device according to an embodiment of the present invention is described below with reference to FIGS. 1 to 5.

First, after program data are stored in the latch unit 165 of the page buffer unit 160, the voltage level of a selected bit line (e.g., BLe) is set to a voltage level (a low level or a high (VCC) level) corresponding to the program data. A program operation is performed by supplying a program voltage to the word line WL of a selected memory cell coupled to the selected bit line at step 410.

Next, a verification operation command for performing a verification operation is received at step 420. In response to the verification operation command, the verification operation command signal EXT_VERIFY and the Y code signal CAM_Y_CODE, stored in a CAM cell, are inputted to the control circuit 110. In response to the signals, the control circuit 110 generates the sense enable signal EN_PBSENSE and the second code signal YV_CODE. The page buffer operation voltage generator 150 generates the precharge signal PRECH_b and outputs it to the page buffer unit 160.

The page buffer unit 160 supplies the sense node SO with the power supply voltage VDD of a high level in response to the precharge signal PRECH_b. At this time, the sense signal PBSENSE and the bit line selection signal BSLe of a high level are received to couple the sense node SO to the even bit line BLe. Accordingly, the even bit line BLe is precharged to a high level voltage at step 430. In this case, assuming that the voltage level of the sense signal PBSENSE is V1, the even bit line BLe is precharged to a voltage level (V1-Vt) (the threshold voltage of the NMOS transistor N15). Next, the precharge signal PRECH_b and the sense signal PBSENSE are disabled.

A verification voltage is supplied to the word line of the selected memory cell, and a pass voltage is supplied to word lines coupled to memory cells other than the selected memory cell. Accordingly, if the selected memory cell is programmed to have a threshold voltage more than a minimum target threshold voltage by means of the above-described program operation, the memory cell is turned off, and the voltage level of the even bit line BLe is maintained at a high level. However, if the selected memory cell is programmed with a threshold voltage less than the minimum target threshold voltage, the memory cell is turned on, and the even bit line BLe is discharged to change the voltage level of the even bit line BLe to a low level. In this case, if the sense signal PBSENSE of a voltage level V2 less than the voltage level V1 is supplied to the NMOS transistor N15, the voltage level of the sense node SO is either maintained or changed in response to a voltage level of the even bit line BLe.

As described above, information as to the voltage level of the even bit line BLe is stored in the data latch unit 165 using the sense node sense unit 167 and the data set unit 166. The information is checked, and a first verification operation is performed according to a result of the check at step 440.

A determination is then made as to whether the first verification operation is a pass at step 450. If, as a result of the determination at step 450, the first verification operation is determined to be a failure, the process preferably returns to the step 410 in which the program operation is performed again. In this case, the program voltage supplied in the program operation is preferably raised by a step voltage.

However, if, as a result of the determination at step 450, the first verification operation is determined to be a pass, the voltage level of the sense signal PBSENSE is set to a voltage level V2' less than the voltage level V2 at step 460. The voltage level of the sense signal PBSENSE can be set by counting the number of verification operations using the code counter 111 of the control circuit 110. The reason for the voltage level of the sense signal PBSENSE being set to a voltage level V2' less than the voltage level V2 is as follows. During the first verification operation (step 440), the voltage level of the even bit line BLe, precharged to a high level in the bit line precharge operation (step 430) must maintain the same level. However, a minute leakage current occurs in the even bit line BLe, and so the voltage level of the even bit line BLe becomes less than the level (V1-Vt) due to the leakage current. In this case, in an MLC on which several verification operations are repeatedly performed, the amount of leakage current with respect to the passage of time is gradually increased. Consequently, although a program operation on the MLC is successful, the program operation for the MLC can be verified as being a failure. To prevent such a problem, the voltage level of the sense signal PBSENSE is set to a new voltage level which is lowered due to the leakage current. In this case, although the verification operations are repeatedly performed, the amount of current flowing through the bit line sense unit 163 is controlled to be constant. Accordingly, errors in verification resulting from the leakage current are prevented.

Next, a verification voltage is supplied to the word line of the selected memory cell, and a pass voltage is supplied to the word lines of the memory cells other than the selected memory cell. If the selected memory cell has been programmed to have a threshold voltage more than a minimum target threshold voltage by means of the above program operation, the memory cell is turned off, and the voltage level of the even bit line BLe is maintained at a high level. However, if the selected memory cell has been programmed with a threshold voltage less than the minimum target threshold voltage, the memory cell is turned on, and so the even bit line BLe is discharged and the voltage level of the even bit line BLe is changed to a low level. In this case, if the sense signal PBSENSE of a voltage level V2' less than the voltage level V2 used in the first verification operation (step 440) is supplied to the NMOS transistor N15, the voltage level of the sense node SO is either maintained or discharged in response to a voltage level of the even bit line BLe.

As described above, information as to the voltage level of the even bit line BLe is stored in the data latch unit 165 using the sense node sense unit 167 and the data set unit 166. The information is checked, and a first verification operation is performed according to a result of the check at step 470.

A determination is then made as to whether the first verification operation is a pass at step 480. If, as a result of the determination at step 480, the second verification operation is determined to be a failure, the process preferably returns to the step 410 in which the program operation is performed again. In this case, the program voltage supplied in the program operation is preferably raised by a step voltage.

Although, in the present embodiment, an example in which only verification operations up to the second verification operation is performed has been described, third and fourth verification operations can be performed after the second verification operation. In this case, the voltage level of the sense signal PBSENSE preferably is set to a level less than a level used in a previous verification operation. Accordingly, errors occurring in the verification operations resulting from the amount of the leakage current, which increases in proportion to a passage of time, are prevented.

According to an embodiment of the present invention, during the verification operation of a nonvolatile memory device, the voltage level of a bit line is precharged to a high level. In several subsequent verification operations, the voltage level of a sense signal for controlling a connection between the bit line and a sense node is sequentially lowered. Accordingly, although the voltage level of the bit line gradually drops after a passage of time, the voltage level of the bit line can be sensed as having a constant voltage level.

What is claimed is:
1. A nonvolatile memory device, comprising:
a memory cell array configured to include a number of memory cells coupled to a bit line;

a control circuit configured to output a code signal in response to a verification operation command signal during a verification operation being performed;
a page buffer operation voltage generator configured to generate a precharge signal and a sense signal in response to the code signal; and
a page buffer configured to precharge the bit line in response to the precharge signal and to sense data programmed into the memory cell in response to the sense signal;
wherein the sense signal having a sequentially lowered voltage level is outputted in response to the verification operation being repeatedly performed.

2. The nonvolatile memory device of claim 1, wherein the page buffer is configured to sense the voltage level of the precharged bit line as having a constant voltage level in response to the sense signal having the sequentially lowered voltage level irrespective of a voltage level of the precharged bit line being lowered after a passage of time.

3. The nonvolatile memory device of claim 1, wherein the control circuit comprises a code counter, the code counter outputting the code signal, including information as to a number of verification operations having been performed, in response to the verification operation command signal, a Y code signal, a program flag signal, and a verification operation enable signal.

4. The nonvolatile memory device of claim 1, wherein the page buffer comprises:
a latch unit configured to either temporarily store the program data or to sense verification data through a sense node or to store the sensed verification data;
a bit line sense unit coupled between the sense node and the bit line and configured to output a voltage level of the bit line to the sense node in response to the sense signal; and
a precharge unit coupled to the sense node and configured to precharge the sense node and the bit line coupled to the sense node, in response to the precharge signal.

5. The nonvolatile memory device of claim 4, wherein the bit line sense unit controls an amount of current flowing through the sense node and through the bit line in response to a second sense signal having a voltage level less than that of a first sense signal supplied during a previous verification operation in response to a number of verification operations being consecutively performed after the bit line has been precharged.

6. The nonvolatile memory device of claim 5, wherein the bit line sense unit controls the amount of current to always be constant in response to a number of verification operations being consecutively performed.

7. A nonvolatile memory device, comprising:
a memory cell array configured to include a number of memory cells coupled to a bit line;
a control circuit configured to output a code signal in response to a verification operation command signal during a verification operation being performed;
a page buffer operation voltage generator configured to generate a precharge signal and a sense signal in response to the code signal, the sense signals having sequentially lowered voltage levels being outputted in response to a number of verification operations being consecutively repeated; and
a page buffer configured to precharge the bit line in response to the precharge signal and to sense data programmed into the memory cell in response to the sense signal.

8. The nonvolatile memory device of claim 7, wherein the page buffer is configured to sense the voltage level of the precharged bit line as having a constant voltage level in response to the sense signal having the sequentially lowered voltage level irrespective of a voltage level of the precharged bit line being lowered after a passage of time.

9. The nonvolatile memory device of claim 7, wherein the control circuit comprises a code counter, the code counter outputting the code signal, including information as to a number of verification operations having been performed, in response to the verification operation command signal, a Y code signal, a program flag signal, and a verification operation enable signal.

10. The nonvolatile memory device of claim 7, wherein the page buffer comprises:
a latch unit configured to either temporarily store the program data or to sense verification data through a sense node or to store the sensed verification data;
a bit line sense unit coupled between the sense node and the bit line and configured to output a voltage level of the bit line to the sense node in response to the sense signal; and
a precharge unit coupled to the sense node and configured to precharge the sense node and the bit line coupled to the sense node, in response to the precharge signal.

11. The nonvolatile memory device of claim 10, wherein the bit line sense unit controls an amount of current flowing through the sense node and through the bit line in response to a second sense signal having a voltage level less than that of a first sense signal supplied during a previous verification operation in response to a number of verification operations being consecutively performed after the bit line has been precharged.

12. The nonvolatile memory device of claim 11, wherein the bit line sense unit controls the amount of current to always be constant in response to a number of verification operations being consecutively performed.

13. A verification method of a nonvolatile memory device having a memory cell array, and including a number of memory cells coupled to a bit line, and a page buffer, having a bit line sense unit configured to couple the bit line to a sense node, the method comprising:
performing a program operation on a selected one of the memory cells by supplying the selected memory cell with a program voltage;
precharging the bit line;
sensing a voltage level of the bit line through the sense node and performing a first verification operation according to the sensed voltage level, the voltage level of the bit line varying according to a program state of the selected memory cell, and the voltage level of the bit line being transmitted to the sense node in response to a first sense signal;
setting a second sense signal having a voltage level less than that of the first sense signal; and
performing a second verification operation with the second sense signal.

14. The verification method of claim 13, further comprising:
setting a third sense signal having a voltage level less than that of the second sense signal after performing the second verification operation; and
performing a third verification operation with the third sense signal.

15. The verification method of claim 13, further comprising determining whether the program operation is a pass or a failure after the first and second verification operations have been performed;

wherein the program operation steps are again performed in response to the program operation being determined to be a failure.

16. The verification method of claim 13, wherein the second verification operation is performed with the second sense signal to compensate for a reduction in a voltage level of the bit line during the second verification operation being performed, the voltage level of the bit line being less than a voltage level of the bit line during the first verification operation being performed.

17. The verification method of claim 13, wherein the bit line sense unit sends a constant amount of current to the sense node in response to the first and second sense signals, irrespective of a voltage level of the precharged bit line being changed.

18. A verification method of a nonvolatile memory device having a memory cell array, and including a number of memory cells coupled to a bit line, and a page buffer, having a bit line sense unit configured to couple the bit line to a sense node, the method comprising:

performing a program operation on a selected one of the memory cells by supplying the selected memory cell with a program voltage;

precharging the bit line;

sensing a voltage level of the bit line through the sense node and performing a verification operation based on the sensed voltage level of the bit line, the voltage level of the bit line varying according to a program state of the selected memory cell, and the voltage level of the bit line being transmitted to the sense node in response to a sense signal supplied to the page buffer;

resetting a voltage level of the sense signal to be less than that of the previously used sense signal; and performing again the verification operation and the reset of the sense signal, the verification operation being repeatedly performed N times, N being a positive integer.

19. The verification method of claim 18, wherein resetting a voltage level of the sense signal comprises resetting the sense signal to a new sense signal having a voltage level less than that of the sense signal used during a previous verification operation.

20. The verification method of claim 18, further comprising determining whether the program operation is a pass or a failure, after the verification operation has been performed;

wherein the program steps are again performed in response to the program operation being determined to be a failure.

* * * * *